US010139275B2

(12) United States Patent
Langner et al.

(10) Patent No.: US 10,139,275 B2
(45) Date of Patent: Nov. 27, 2018

(54) APPARATUS FOR SPECTROMETRICALLY CAPTURING LIGHT WITH A PHOTODIODE WHICH IS MONOLITHICALLY INTEGRATED IN THE LAYER STRUCTURE OF A WAVELENGTH-SELECTIVE FILTER

(71) Applicant: TECHNISCHE UNIVERSITÄT DRESDEN, Dresden (DE)

(72) Inventors: Maik Langner, Dresden (DE); Hartmut Fröb, Glashütte (DE); Vadim G. Lyssenko, Dresden (DE); Markas Sudzius, Dresden (DE); Karl Leo, Dresden (DE)

(73) Assignee: TECHNISCHE UNIVERSITÄT DRESDEN, Dresden (DE)

( * ) Notice: Subject to any disclaimer, the term of this patent is extended or adjusted under 35 U.S.C. 154(b) by 0 days.

(21) Appl. No.: 15/516,902

(22) PCT Filed: Oct. 7, 2015

(86) PCT No.: PCT/DE2015/000503
§ 371 (c)(1),
(2) Date: Apr. 5, 2017

(87) PCT Pub. No.: WO2016/055047
PCT Pub. Date: Apr. 14, 2016

(65) Prior Publication Data
US 2017/0241836 A1   Aug. 24, 2017

(30) Foreign Application Priority Data

Oct. 7, 2014   (DE) .................. 10 2014 014 981

(51) Int. Cl.
*G01J 3/26* (2006.01)
*G01J 3/36* (2006.01)
(Continued)

(52) U.S. Cl.
CPC .............. *G01J 3/0259* (2013.01); *G01J 3/26* (2013.01); *G01J 3/28* (2013.01); *G01J 3/36* (2013.01);
(Continued)

(58) Field of Classification Search
CPC .... G01J 2003/1234; G01J 3/0259; G01J 3/26; G01J 3/28; H01L 51/441; H01L 51/447
See application file for complete search history.

(56) References Cited

U.S. PATENT DOCUMENTS 5,455,421 A   10/1995   Spears
6,380,531 B1   4/2002   Sugihwo et al.
(Continued)

OTHER PUBLICATIONS

International Search Report issued in PCT/DE2015/000503, dated Jan. 27, 2016.

*Primary Examiner* — Mark R Gaworecki
(74) *Attorney, Agent, or Firm* — Heslin Rothenberg Farley & Mesiti P.C.

(57) ABSTRACT

Apparatus for spectrometrically capturing light includes a wavelength-adjustable filter for converting spectral information into location information and an organic photodiode for converting the location information into electrical signals which can be forwarded, wherein the filter and the organic photodiode form a one-piece monolith, the organic photodiode is connected to the filter or the organic photodiode is integrated in the filter, the filter consists of at least one spectrally resolving element in the form of at least one layer-like photonic crystal which constitutes the monolith and in which two layers of variable thickness D are formed along a direction perpendicular to the incidence of light. A resonant layer is arranged between the two layers. The organic photodiode includes: a photoactive layer, a first electrode, and a second electrode sandwiching the photoac-
(Continued)

tive layer, and one of the electrodes is in contact with the photonic crystal.

14 Claims, 10 Drawing Sheets

(51) Int. Cl.
*G01J 3/02* (2006.01)
*G01J 3/28* (2006.01)
*H01L 51/44* (2006.01)
*H01L 27/30* (2006.01)
*G01J 3/12* (2006.01)

(52) U.S. Cl.
CPC .......... *H01L 27/305* (2013.01); *H01L 51/441* (2013.01); *H01L 51/447* (2013.01); *G01J 2003/1234* (2013.01); *Y02E 10/52* (2013.01)

(56) References Cited

U.S. PATENT DOCUMENTS

| | | |
|---|---|---|
| 2002/0017612 A1 | 2/2002 | Yu et al. |
| 2009/0220189 A1 | 9/2009 | Kiesel et al. |
| 2012/0136227 A1 | 5/2012 | McKenna |
| 2014/0106468 A1 | 4/2014 | Boersma |

APPARATUS FOR SPECTROMETRICALLY CAPTURING LIGHT WITH A PHOTODIODE WHICH IS MONOLITHICALLY INTEGRATED IN THE LAYER STRUCTURE OF A WAVELENGTH-SELECTIVE FILTER

CROSS REFERENCE TO RELATED APPLICATIONS

This application is the National Phase filing under 35 U.S.C. § 371 of International Application No. PCT/DE2015/000503, filed on Oct. 7, 2015, and published on Apr. 14, 2016, as WO/2016/055047 A1, and claims priority to German Application No. 102014014981.1, filed on Oct. 7, 2014. The contents of each of the prior applications are hereby incorporated by reference herein in their entirety.

BACKGROUND ART

The invention relates to an apparatus for spectrometrically capturing light, which comprises at least
  a wavelength-adjustable filter for converting spectral information into location information and
  an organic photodiode designed as a detector for converting the location information into electrical signals that can be retransmitted,
wherein the filter and the organic photodiode form a single-piece monolith, wherein the organic photodiode is combined with the filter in a connection arrangement or the organic photodiode is integrated into the filter, wherein the filter consists at least of a spectrally resolving element in the form of at least one layer-like photonic crystal constituting the monolith, in which two layers with variable thickness D are formed along a direction perpendicular to the incident light, wherein a resonance layer is arranged between the two layers, wherein the organic photodiode contacting the filter consists at least of the following detector layers:
  a photo-active layer,
  a first electrode of the photo-active layer and
  a second electrode of the photo-active layer,
wherein the photo-active layer is located between the two electrodes and one of the electrodes is in contact with the photonic crystal.

PRIOR ART

Figure 7:
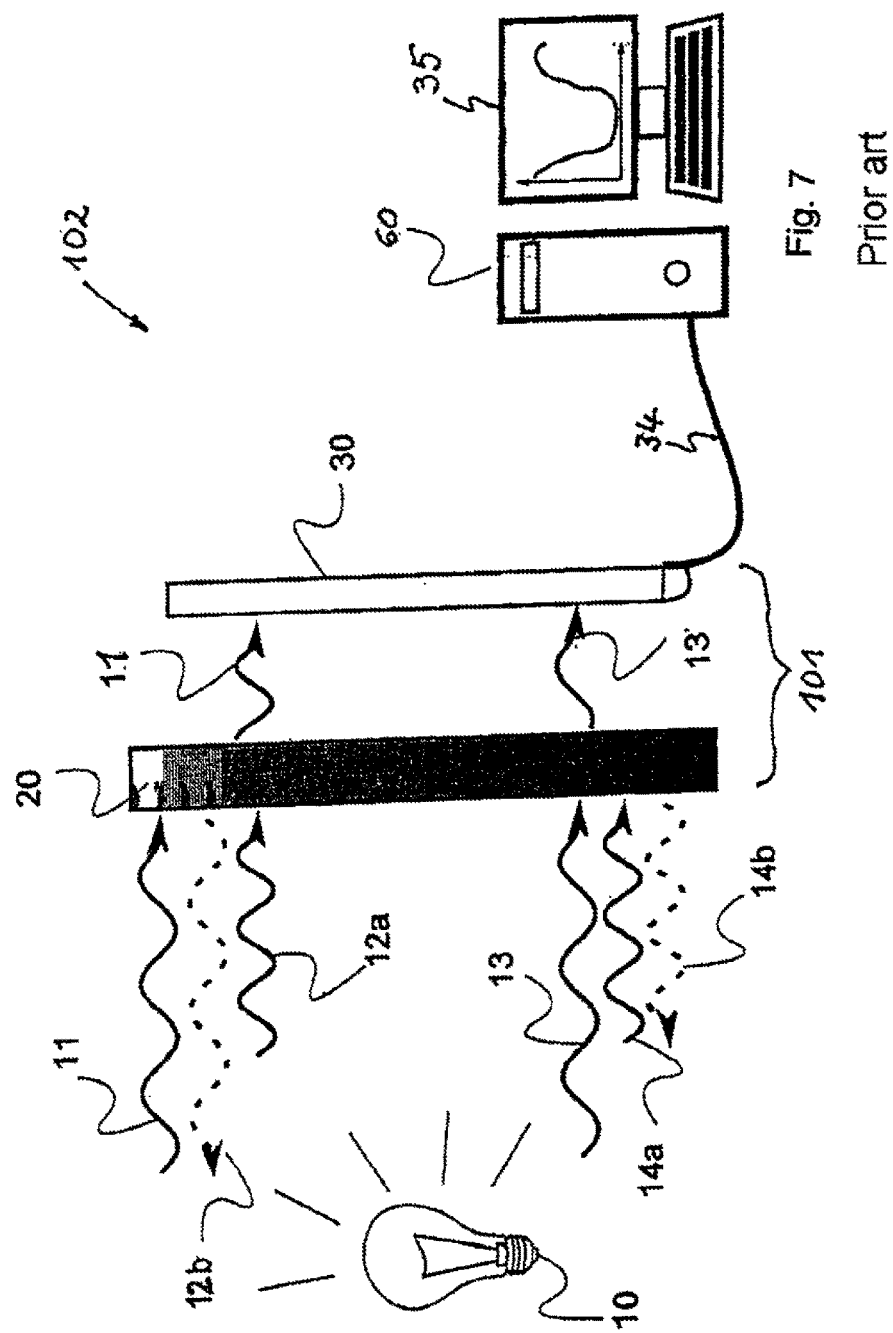

A conventional spectrally resolving device 101, such as that shown in FIG. 7, inside a spectrometric apparatus 102 consists of at least one filter 20 which converts the spectral information into a location information item, and a detector 30 which converts the acquired location information, in the form of the signal which is then to be assigned in a restricted wavelength range, into a data stream. The two components—filter 20 and detector 30—are produced separately and must then be adjusted and fixed in place. This makes mass production difficult to implement, not least as a result of the high costs, and the mechanical stability and the geometric expansion that may be required can hinder their use in some deployment locations and applications.

In patent US 2014/0 106 468 A1, a photonic crystal sensor and a method for detecting an analyte are described.

The sensor consists of a photonic crystal, wherein the photonic crystal is formed from an analyte-sensitive polymer-based material, wherein the material can be deformed on contact with the analyte, wherein the contact causes a change in an optical property of the photonic crystal or a change in the refractive index of the material thereof is caused by the contact with the mentioned analyte-sensitive material and the analyte-sensitive material forms part of a periodic structure of the photonic crystal, wherein the structure has alternate zones of a relatively high refractive index and zones of a relatively low refractive index, wherein the alternating zones are provided in one or two orthogonal directions of the analyte-sensitive material.

The associated method for producing such an optical sensor, which comprises the photonic crystal for detecting an analyte, comprises the following steps:
  creating a stamp having a surface that contains a pattern for imprinting a periodic structure for the photonic crystal,
  creating a print-capable analyte-sensitive material for the photonic crystal,
  imprinting the periodic structure into the print-capable material by pressing the said surface of the stamp into a surface of the print-capable material, optionally hardening the material into which the periodic structure has been pressed, and wherein the imprinting and the optional hardening of the photonic crystal are carried out, wherein the material of the photonic crystal into which the periodic structure has been imprinted, can be deformed when contacted with the analyte, wherein the deformation of the material changes an optical property of the photonic crystal, or where the refractive index of the material of the photonic crystal into which the periodic structure has been imprinted, is variable due to the contact with the analyte.

The disadvantage is due to the fact that the said sensor is designed for a specific analyte and that this must interact with the sensor for the purpose. The property that is subsequently measured is, e.g., the spectral shift of a resonance, or an intensity change. The disadvantage here is that this process requires a certain time t (several s up to a several minutes) until an equilibrium is achieved, both for the detection of the analyte as well as for the subsequent reactivation of the sensor. It is also not clear in what form a broad spectrum of light is analysed by the sensor.

In patent US 2012/0 136 227 A1, a spectrophotometric sensor is described that consists of the following elements:
  a sensor body,
  a light-emitting element that is adjacent to the sensor body,
  a wavelength-discriminating detector arranged on the sensor body, wherein said wavelength-discriminating detector consists of an organic light-emitting diode or an organic photodetector.

The wavelength-discriminating detector captures light of one or a plurality of discrete wavelengths.

The organic light-emitting diode or the organic photodetector can consist of:
  an organic layer,
  a substrate layer and
  one or a plurality of transparent electrode layers.

The disadvantage is due to the fact that the described sensor only allows a coarse resolution of a spectrum, i.e. spectral bands of 50-100 nm in width can be captured separately from one another, because any detection/separation takes place only via the absorption characteristics of the OLEDs or photodetectors respectively. In addition, with the use of reverse-biased OLEDs as proposed, only a poor efficiency of the signal acquisition can be expected.

In patent US 2009/0 220 189 A1, a detector system for acquiring transmitted light with lateral changes is described.

The detector system comprises an optical sensor that emits one or more sub-bands of optical wavelengths when said sensor is illuminated with a broad band of optical wavelengths, and a detector comprising at least one layer with laterally variable transmission characteristics, wherein the detector receives output light by means of the optical sensor and transmits part of the light received at one position from at least one layer, wherein the detector uses the position to determine wavelength changes in the light output from the optical sensor.

A disadvantage is that the detector system requires an additional optical sensor for the pre-selection of the broadband spectrum and subsequent coupling into the detector. In addition, from the description a complete monolithic connection between the spectral filter element and the optical readout units is evident, which requires an alignment of the components with respect to one another (at least I have not found any mention of monolithic). A further disadvantage is the use of conventional photosensors made from inorganic semiconductor material, the production of which is laborious and costly. Due to the different materials/methods for producing the film structures of the photonic crystals, the combination or even integration of the sensors into/with photonic crystals is difficult if not impossible.

OBJECT OF THE INVENTION

The object of the invention is to specify an apparatus for spectrometrically capturing light, which is suitably designed such that the spectral decomposition of the input signal and the conversion into a data stream that can be evaluated can take place within a single-piece component structure at the same time. The use of organic semiconductors enables a cost-effective and easily integratable production. In addition, due to optical amplification effects of the filter, the interaction of the detector with the light spectrum to be analysed is increased and its sensitivity is therefore improved.

DESCRIPTION

The apparatus for spectrometrically capturing light comprises at least
  a wavelength-adjustable filter for converting spectral information into location information and
  an organic photodiode designed as a detector for converting the location information into electrical signals that can be retransmitted, wherein the filter and the organic photodiode form a single-piece monolith, wherein the organic photodiode is combined with the filter in a connection arrangement or the organic photodiode is integrated into the filter, wherein the filter at least a spectrally resolving element in the form of at least one layer-like photonic crystal constituting the monolith, in which two layers with variable thickness D are formed along a direction perpendicular to the incident light, wherein a resonance layer is arranged between the two layers, wherein the organic photodiode contacting the filter consists at least of the following detector layers
  a photo-active layer,
  a first electrode of the photo-active layer and
  a second electrode of the photo-active layer, wherein the photo-active layer is located between the two electrodes and one of the electrodes is in contact with the photonic crystal, wherein in accordance with the characterizing part of claim 1 the detector layers the photoactive layer, the first electrode of the photoactive layer and the second electrode of the photoactive layer, are located within the resonance layer of the photonic crystal of the filter.

A wavelength-adjustable filter within the meaning of the invention designates an optical component that can spatially separate spectral components of the light or the light signal. The wavelength adjustment is determined by the layer sequence and the layer thicknesses of the individual layers.

According to the invention organic photodiodes designate layer sequences consisting of at least one photoactive organic semiconductor material, and two electrodes for transporting away the charge carriers generated, and thus the electrical signal generation. Other auxiliary layers made of different materials may be used to vary the efficiency or sensitivity (intensity or spectrum). These include electron/hole blockers, transport layers for charge carriers, doped layers. Using local variation of the layer composition (for example, the type and quantity of the absorbing molecules), the optimal working range of the detector can be adapted to the spectral pattern of the filter structure. This can be achieved e.g. by off-axis vapour deposition methods, temporary shadowing of individual areas, printing methods or centrifuge-based and immersion procedures.

In this case, the mode of operation of a micro-resonator ensures an increased interaction between the detector/photodiode and the filtered photons.

For resonant frequencies/wavelengths, standing electromagnetic waves are formed in the resonance layer, the field amplitude of which is several times that of the output value of the incident wave. The intensity is proportional to the square of the amplitude, so that in the case of an organic detector with photoactive material of low absorption coefficient, its sensitivity is increased.

In a model of a typical micro-resonator, photons that are located in the resonance layer pass through this layer Q times, where Q indicates the quality factor of a micro-cavity, which is essentially defined by the reflection capability of its mirrors. The larger the Q-factor (the more reflective its mirrors, where the state-of-the-art is >1,000-10,000), the more frequently a photon passes through the resonance layer, i.e. the more effectively is the detector thickness multiplied and the probability that a photon generates an electrically detectable electron-hole pair is dramatically increased.

The filter and the photodiode arranged downstream of the entry surface of the filter contact each other in such a way that they form the monolithic unit, wherein the filter consists at least of a spectrally resolving element in the form of at least one photonic crystal, in which at least one layer is formed having variable thickness D along a direction perpendicular to the incident light, wherein the organic photodiode contacting the filter consists at least of the following detector layers:
  the photoactive layer,
  the first electrode of the photoactive layer and
  the second electrode of the photoactive layer,
  wherein the photoactive layer is located between the two electrodes and one of the two electrodes is in contact with the photonic crystal.

The other of the two electrodes of the photoactive layer can be connected to a plane-parallel layer-like substrate.

The photoactive layer of the organic photodiode can contain charge carriers, generated by means of light irradiation, in the entire spectrally sensitive range.

The filter can be designed as a linear graduated filter with Bragg reflectors.

The filter can be designed as a wavelength-dependent micro-resonator, wherein the micro-resonator is designed as a dielectric mirror arrangement and at least consists of a first mirror layer arrangement having alternating material layers of high refractive index and low refractive index, a second mirror layer arrangement having alternating material layers of high refractive index and low refractive index, a resonance layer arranged between the two mirror arrangements.

On the other hand, the filter can be designed as a wavelength-adjustable micro-resonator, wherein the micro-resonator at least consists of:
a first layer stack having a first specified refractive index,
a second layer stack having a second specified refractive index, wherein the first and the second refractive index differ from each other, and
a resonance layer arranged between the two layer stacks, wherein at least one of the two layer stacks or at least the resonance layer is designed with variable constantly increasing thickness D along the direction perpendicular to the incident light.

A transparent layer can be applied on one of the layer arrangements as a substrate for mechanically stabilizing the filter.

The wavelength-dependent and wavelength-adjustable micro-resonator can thus be designed wedge-shaped.

A spectrometric apparatus for capturing light using the above-mentioned device can comprise at least
a light source,
a filter for converting spectral information into location information having an entry surface, on which the light components from the light source are incident,
a detector in the form of an organic photodiode for capturing the location information and for converting the location information into electrical signals that can be retransmitted,
an evaluation unit, which is connected to the organic photodiode via signal-carrying conductors, and
a display unit, wherein in accordance with the characterizing part of claim 10 the filter and the photodiode arranged downstream of the entry surface of the filter contact each other in such a way that they form a single-piece monolithic unit, wherein the filter consists at least of a spectrally resolving element in the form of at least one layer-like photonic crystal, in which at least one layer is designed with a variable thickness D for adjusting a specified wavelength range along a direction perpendicular to the incident light, wherein the photodiode contacting the filter consists at least of the following detector layers:
a photoactive layer,
a first electrode of the photo-active layer and
a second electrode of the photo-active layer, wherein the photo-active layer is located between the two electrodes and one of the two electrodes is in contact with the photonic crystal, and the detector layers are located within the resonance layer of the photonic crystal of the filter.

The other of the two electrodes of the photoactive layer can be connected to a layer-like substrate which is flat on both sides.

At least one of the electrodes of the detector can be structured.

The connecting conductors for conveying the signal can be situated between the detector and the evaluation unit.

After its passage through the filter, there is a transmitted component of the incident light emitted from the light source in the transparent region of the apparatus, wherein the component of the transmitted light generates charge carriers in the sensitive region of the photoactive layer, which form an optical signal and are converted into an electrical signal that can be retransmitted, and wherein the electrical signal obtained is passed via the connecting conductors to the evaluation unit for evaluation.

In summary the following can be described:
a photonic crystal, e.g. a micro-resonator, is used as a spectrally resolving element, in which at least one material layer is designed with a wavelength-adjustable variable thickness D along a direction perpendicular to the incident light.

For the detection a location-sensitive layer structure which is arranged along the spectrally resolving element is used, e.g. an organic photodiode/solar cell or Perovskite, in which photons are converted into charge carriers. Via the electrodes thereof, the location of the signal, and by means of a calibration the spectral information, can then be obtained.

Depending on the specific layer structure and the materials used, the detector can therefore be arranged downstream of the filter in direct contact with it, or in an even closer engagement with the filter, embedded in the resonance layer thereof.

BRIEF DESCRIPTION OF THE DRAWING FIGURES

Figure 1:
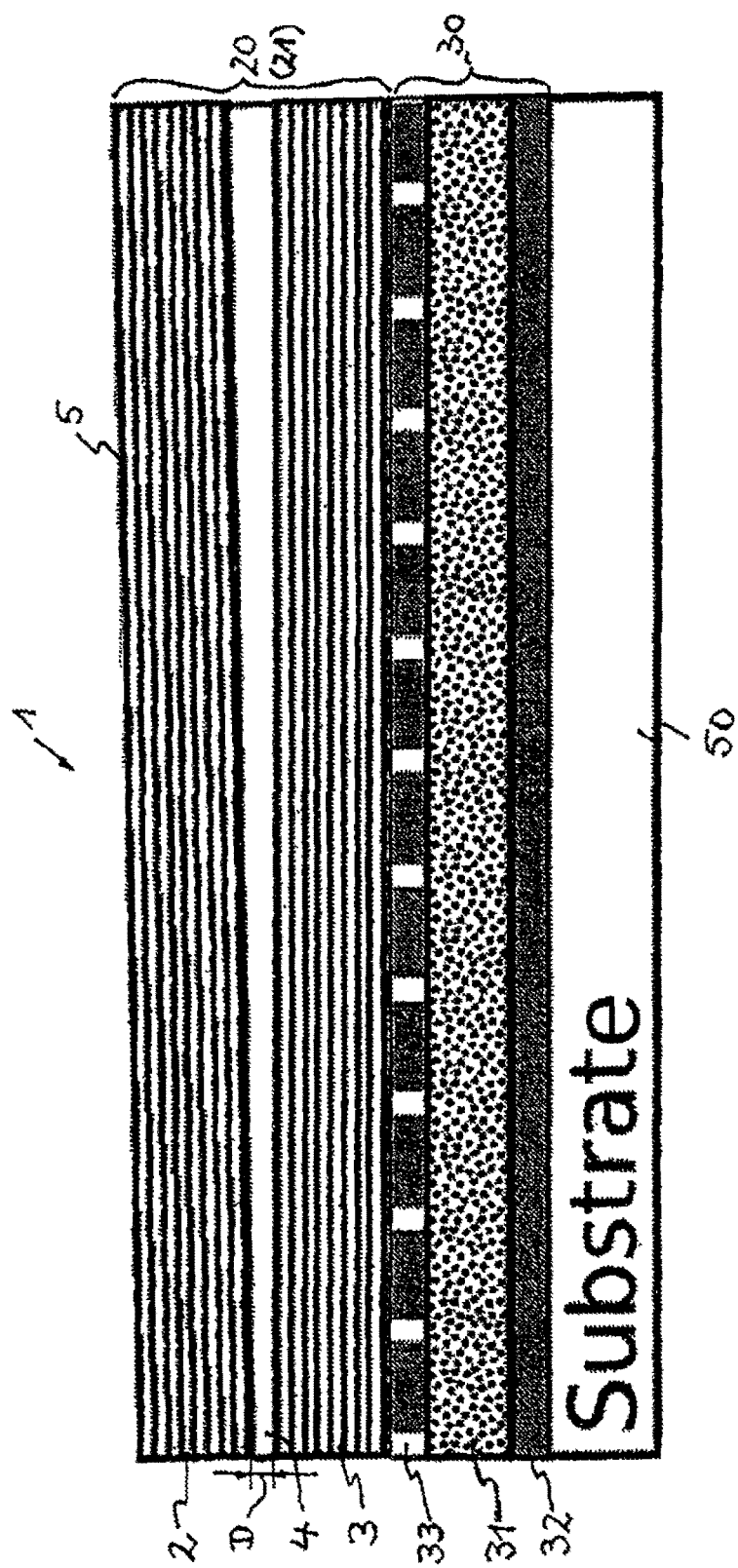
Figure 1A:
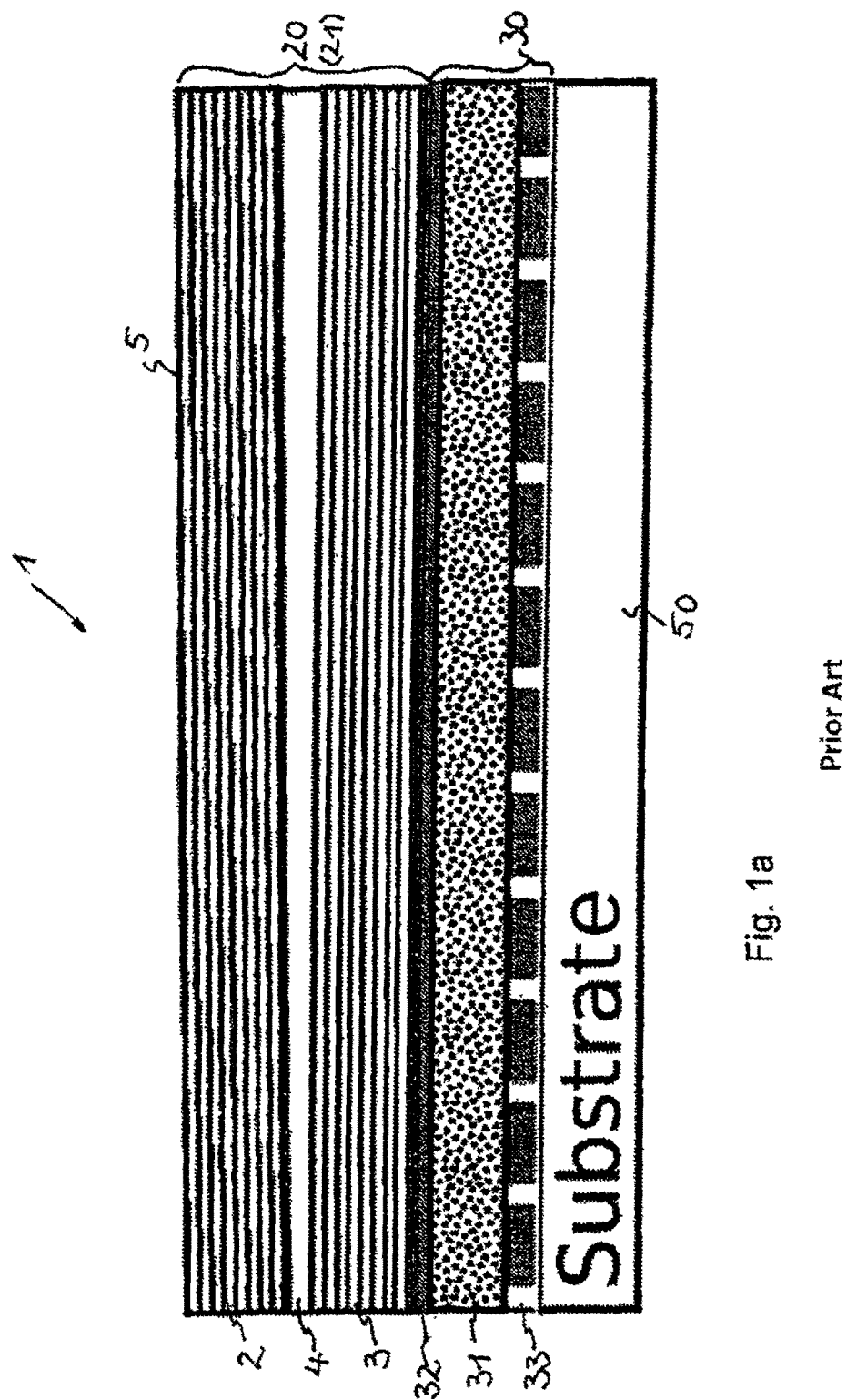
Figure 1B:
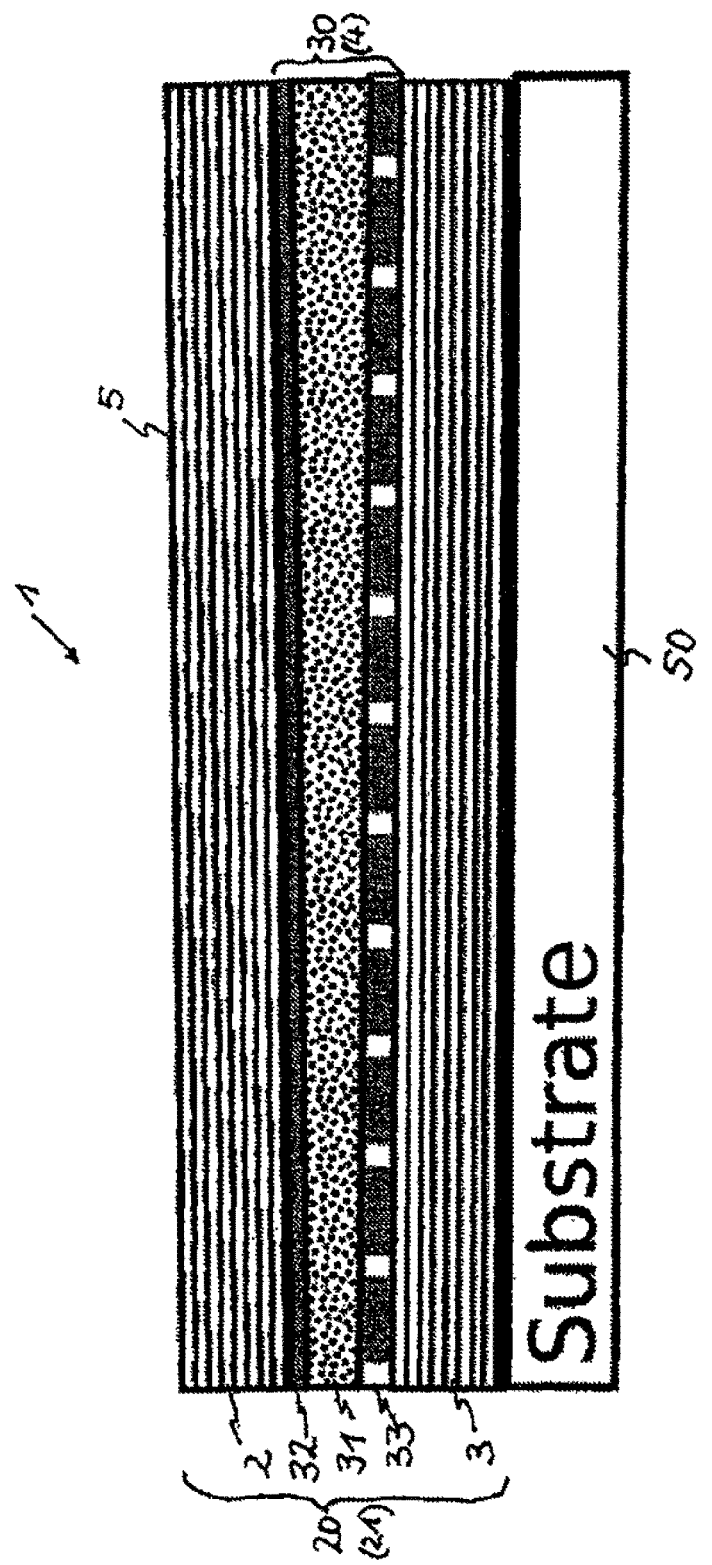
Figure 1C:
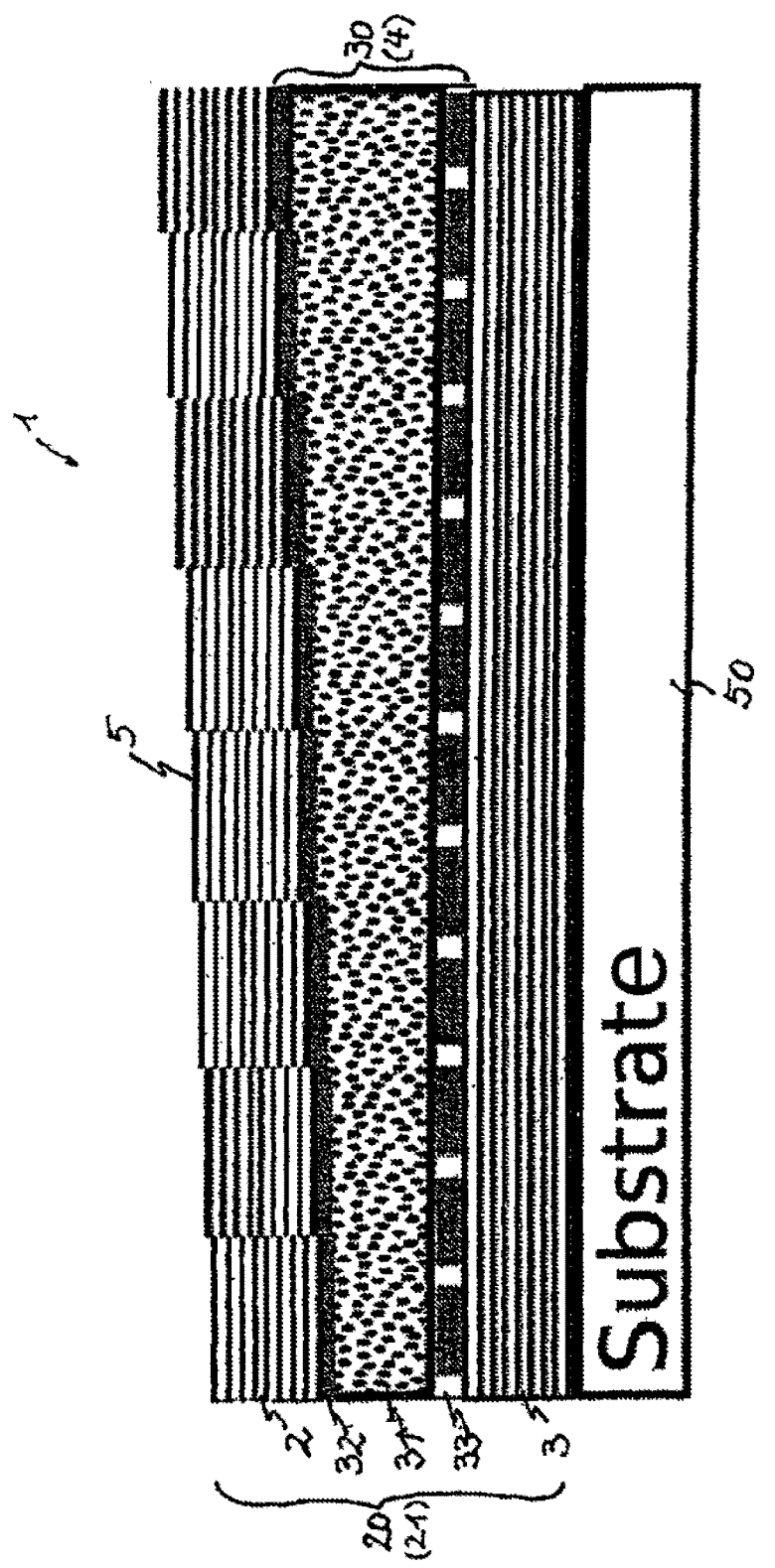
Figure 2:
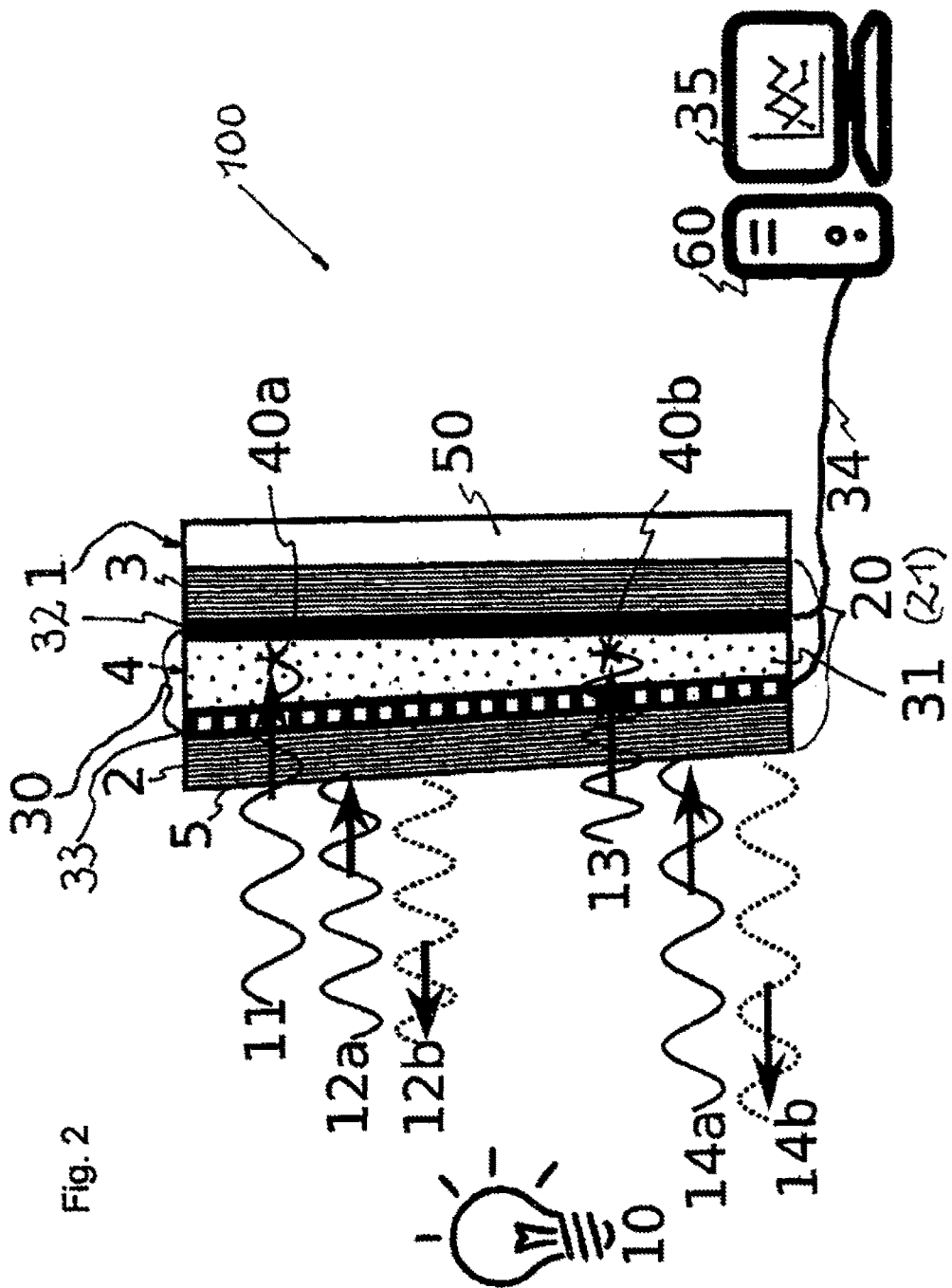
Figure 3:
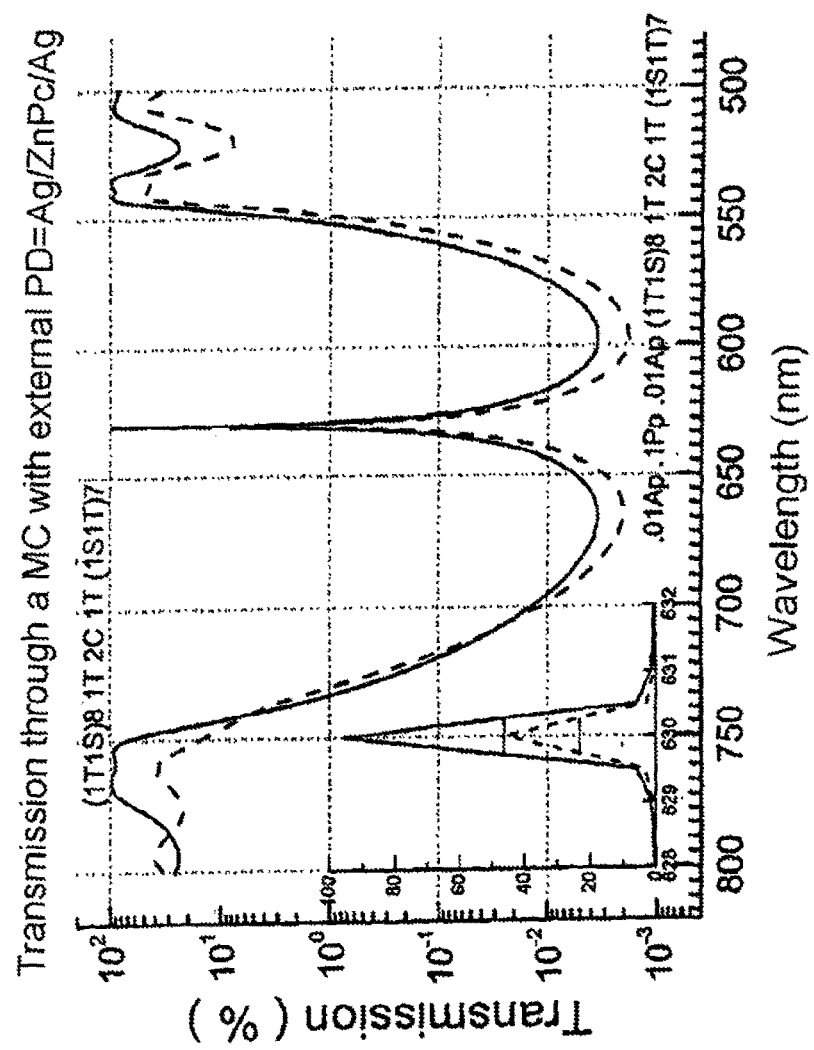
Figure 4:
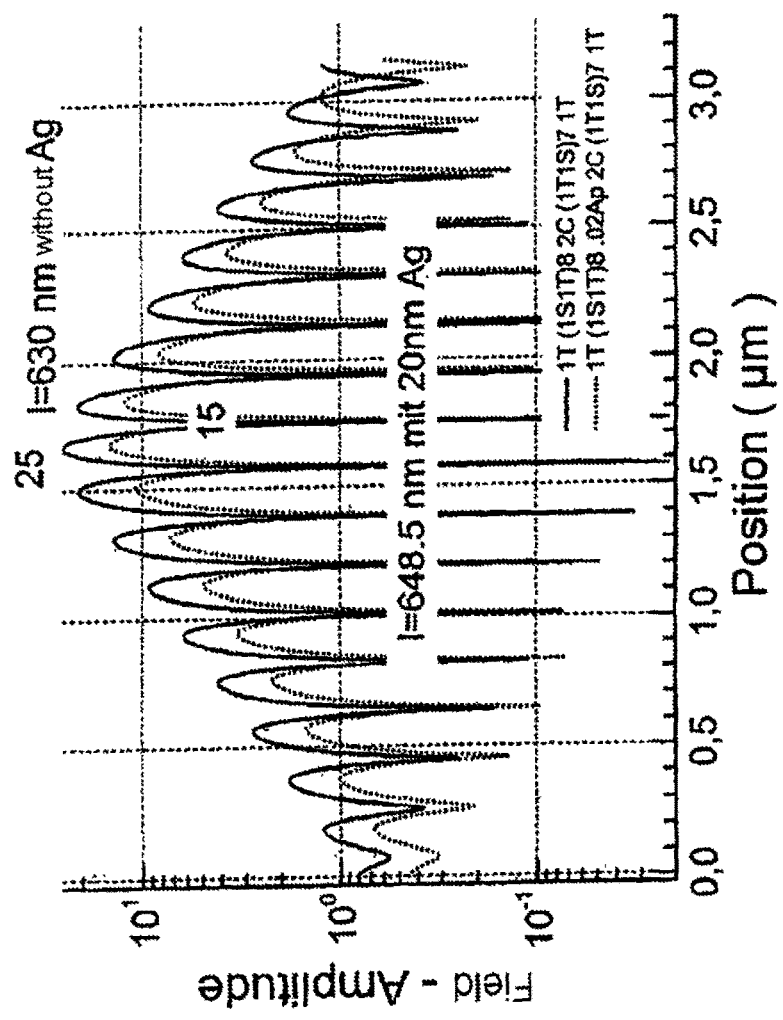
Figure 5:
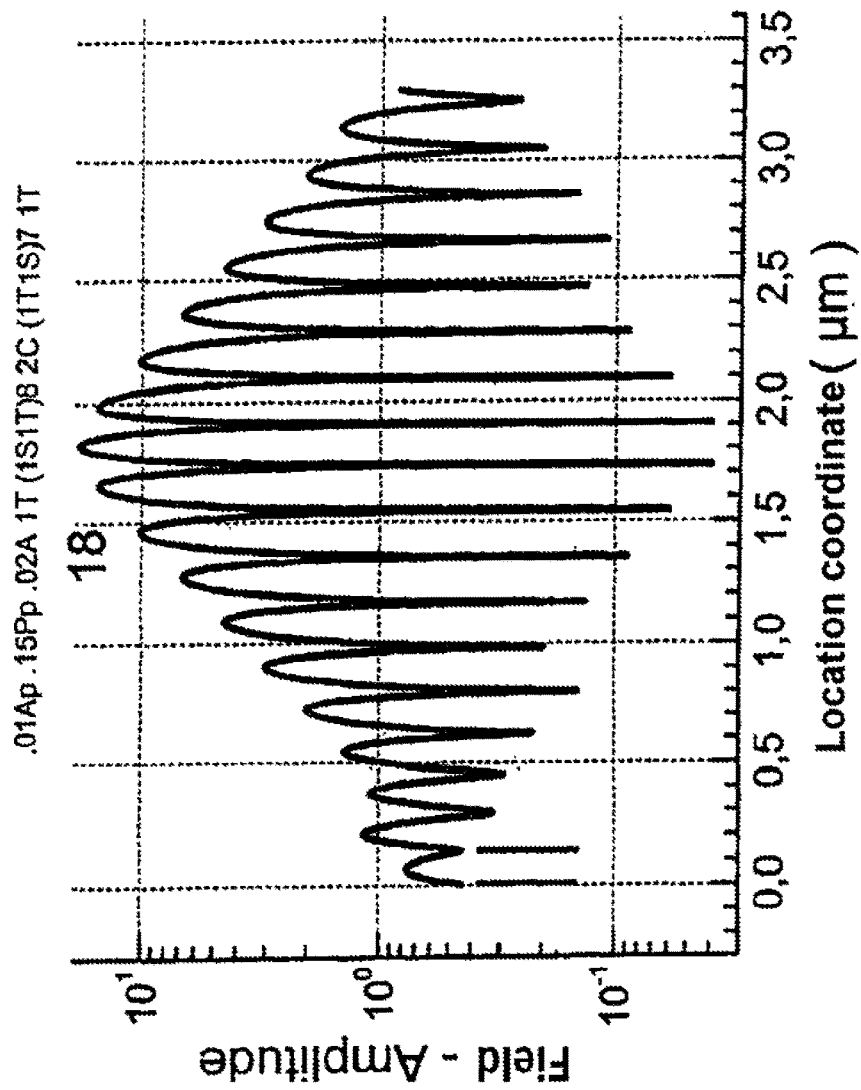
Figure 6:
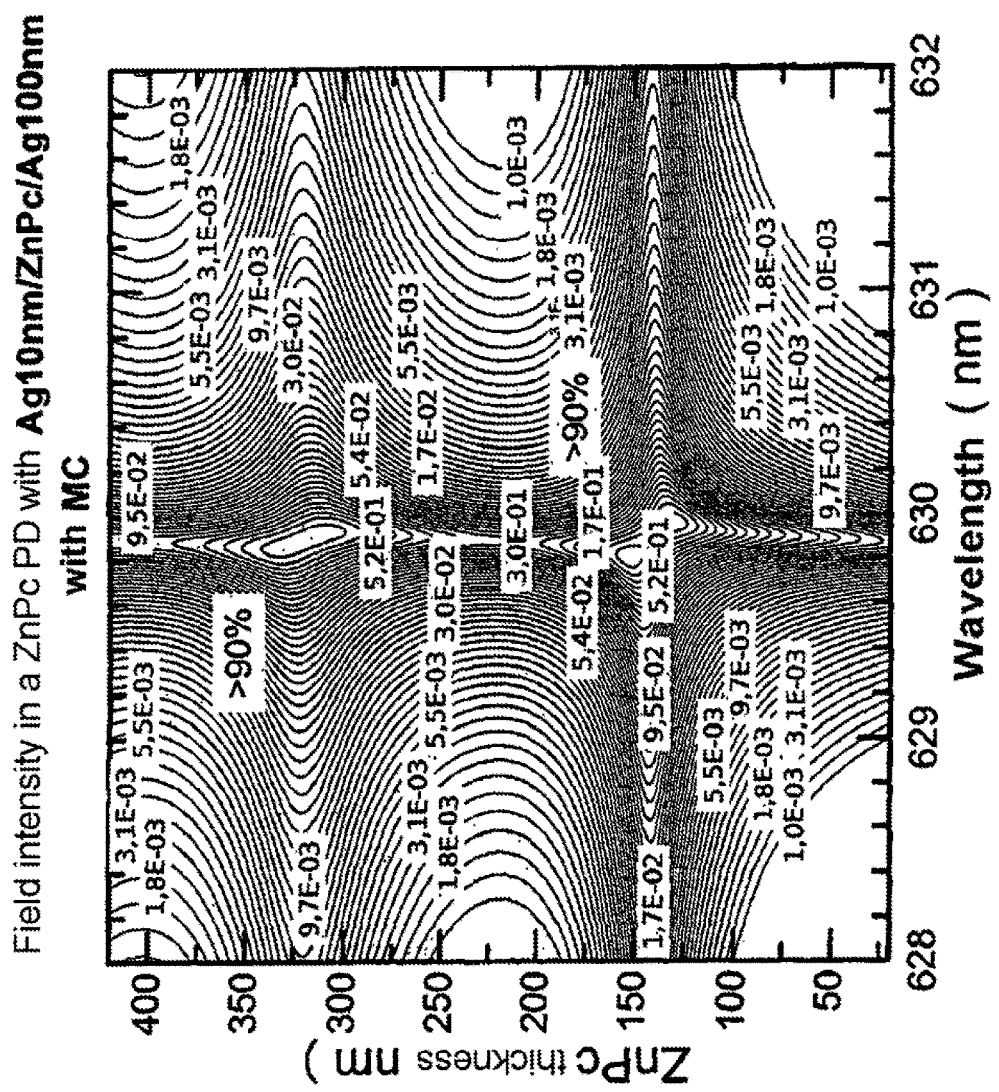

The invention is now described in further detail by reference to exemplary embodiments and with the aid of a number of drawings:

Shown are:

FIG. 1 a schematic representation of a monolithic device for capturing light, in particular, pulses of light, wherein shown in FIG. 1a a second monolithic device, FIG. 1b a third monolithic device according to the invention and FIG. 1c a fourth monolithic device according to the invention, FIG. 2 a schematic representation of a spectrometric apparatus for capturing light, in particular pulses of light, having the monolithic device according to FIG. 1, FIG. 3 a representation of the transmission of the structure formed by photodiode and micro-cavity (1T1S)8 1T 2mC 1T (1S1T) 7 as a function of the wavelength with a comparison of the transmission characteristics of a single micro-cavity having the respective layer composition, containing two dielectric mirror layers (1T1S)8 1T and 1T(1S1T)7 and the different structures, wherein 2C represents low refractive-index material with an optical thickness of $\lambda/2$ and 4C represents low refractive-index material with a thickness $\lambda$, and 10/100 Ap 100/125zp 10/20 AP leading to 10/100 nm Ag (silver), 100/125 nm photodiode (ZnPc—zinc phthalocyanine as a representative absorbent layer), 10/20 nm Ag (silver) behind the micro-cavity, FIG. 4 a representation of the field amplitude with/without metal layer (e.g. Ag) on the inside of the resonance layer of a micro-resonator, wherein despite the low transmission level of 20 nm silver, by means of the arrangement at a field node, the increase in the field amplitude only reduces from a factor of 25 to a factor of 15, FIG. 5 a representation of a field amplitude curve in an arrangement of a model photodiode (10 nm Ag, 150 nm ZnPc ag, 20 nm Ag) behind a micro-cavity (resonance layer of a filter), wherein despite the absorptive nature of the photodiode the maximum field amplitude of the micro-resonator corresponds to a gain of "18", FIG. 6 a representation of the intensity curve of the electric field for the photo diode downstream of the micro-cavity as shown in FIG. 5, plotted against wavelength and the thickness of the organic layer and FIG. 7 a schematic representation of a spectrometric apparatus for capturing light having a device according to the prior art.

FIG. 1 shows an apparatus 1 for spectrometrically capturing light, in particular pulses of light, wherein the apparatus 1 comprises at least:
- a wavelength-adjustable filter 20 for converting spectral information into location information and
- an organic photodiode 30 designed as a detector for converting the location information into electrical signals that can be retransmitted.

DETAILED DESCRIPTION

The filter 20 and the organic photodiode 30 form a single-piece monolith, wherein the organic photodiode 30 is combined with the filter 20 in a connection arrangement or the organic photodiode 30 is integrated into the filter 20.

The filter 20 and the photodiode 30 arranged downstream of the entry surface 5 of the filter 20 contact each other in such a way that they form the monolithic unit, wherein the filter 20 in detail at least consists of a spectrally resolving element in the form of at least one photonic crystal 21, in which at least one layer 2, 3 is designed with a variable wavelength-matched adjustable thickness D along a direction perpendicular to the incident light, wherein the organic photodiode 30 contacting the filter 20 consists at least of the following detector layers:
- a photo-active layer 31 for generating charge carriers,
- a first electrode 33 of the photoactive layer 31 and
- a second electrode 32 of the photoactive layer 31, wherein the photoactive layer 31 is located between the two electrodes 33, 32 and one of the two electrodes, the first electrode 33, is in close contact with the photonic crystal 21.

The other second electrode 32 of the photoactive layer 31 can be connected to a layer-like substrate 50, designed in the form of a layer, which is flat on both sides.

According to the invention the detector layers 33, 32, 31 of the photo diode 30 according to FIG. 1b, FIG. 1c and FIG. 2:
- the photoactive layer 31 for generating charge carriers,
- the first electrode 33 of the photoactive layer 31 and
- the second electrode 32 of the photoactive layer 31 are integrated within the resonance layer 4 of the photonic crystal 21 and between the opposite facing layer arrangements 2 and 3.

The detector layers 33, 32, 31 can also be integrated into the filter 20 and with the surrounding filter 20 form the monolithic unit.

In the photoactive layer 31 of the organic photodiode 30, in particular in the sensitive region of the device 1, by generation by means of incident light 11 or 13 respectively, charge carriers 40a can be located in the long-wavelength sensitive range and charge carriers 40b in the short-wavelength sensitive range of the photo diode 30, as shown in FIG. 2.

Since due to the regularity/periodicity an analogy can be made to the treatment of crystal structures in solid state theory, photonic structures are also designated by the term photonic crystals.

The dimensionality of these identifies the number of spatial directions that possess photonically effective variations, i.e. a one-dimensional photonic crystal only undergoes a refractive index change in one spatial direction (e.g. upwards), while the other two spatial directions (in the plane) show no variation.

The filter 20 can be designed as a linear graduated filter with Bragg reflectors.

The filter 20 can be designed as a wavelength-adjustable micro-resonator, wherein the micro-resonator is designed as a dielectric mirror arrangement, which at least consists of a first mirror layer arrangement 2 having alternating material layers of high refractive index and low refractive index, a second mirror layer arrangement 3 having alternating material layers of high refractive index and low refractive index, a resonance layer 4, which is arranged between the first mirror layer arrangement 2 and the second mirror layer arrangement 3, and a transparent layer 50 as a stabilizing element, wherein at least one of the two mirror layer arrangements 2, 3 or at least the resonance layer 4 is designed with variable constantly increasing thickness D along the direction perpendicular to the incident light.

The filter 20 shown in FIG. 1 can also be designed as a wavelength-adjustable micro-resonator 21, wherein the micro-resonator 21 at least consists of:
- a first layer stack 2 having a first specified refractive index, a second layer stack 3 having a second specified refractive index, the first and the second index refractive index being different from each other, and
- a resonance layer 4 arranged between the two layer stacks 2, 3, wherein at least one of the two layer stacks 2, 3 or at least the resonance layer 4 is designed with variable constantly increasing thickness D along the direction perpendicular to the incident light.

A transparent layer can be applied on one of the layer arrangements 2 or 3 as a substrate 50 for mechanically stabilizing the filter 20.

The wavelength-adjustable micro-resonator 21 can therefore be designed wedge-shaped.

FIG. 1a shows a second monolithic apparatus 1 in the form of a wedge-shaped micro-resonator with a reversal of the electrodes 32, 33 with steadily increasing (divergent) thickness, as shown in FIG. 1.

FIG. 1b shows a third monolithic device 1, also in the form of a wedge-shaped micro-resonator, comprising a resonance layer according to FIG. 1 having a constantly increasing (divergent) variable thickness, wherein the resonance layer 4 of FIG. 1 is replaced in FIG. 1b by the integrated detector 30 and is arranged integrated between the layers 2 and 3 with constantly increasing (divergent) thickness.

FIG. 1c shows a fourth monolithic apparatus 1 in the form of a micro-resonator having detector 30, which in some sections is divergent in a step-shaped manner, instead of the inner resonance layer 4, wherein the upper layer 2 while having a constant thickness in the sections thereof, due to the step-shaped detector 30 assumes the stepped structure of the detector 30 however, and the lower layer 3 is designed as a layer which is flat on both sides adjacent to the substrate 50.

The resonance layer 4 of the micro-resonator 21 is also known as a micro-cavity (MC).

FIG. 3 shows a representation of the transmission of the structure (1T1S)8 81T 2mC 1T (1S1T) 7 with a comparison of the transmission characteristics of a single micro-cavity (MC) having the respective layer composition, containing two dielectric mirror layers (1T1S)8 1T and 1T(1S1T)7 and the different structures, wherein 2C represents low refractive-index material 2 and 4C represents low refractive-index material with λ, and 10 Ap 100Zp 10 AP leading to 10 nm Ag, 100 nm photodiode 30 (ZnPc—zinc phthalocyanine as a representative absorbent layer), 10 nm Ag behind the micro-cavity (MC).

In this, the symbols mean the following
1T a λ/4 thick layer of titanium dioxide,
2T a λ/2 thick layer of titanium dioxide,
1S a λ/4 thick layer of silicon dioxide,
2S a λ/2 thick layer of silicon dioxide,
(1T1S)7 a dielectric mirror consisting of seven titanium dioxide/silicon dioxide layer pairs,
(1T1S)8 a dielectric mirror consisting of eight titanium dioxide/silicon dioxide layer pairs,
2mC m multiples of a λ/2-layer of low refractive index material (n=1.5).

FIG. 4 shows a representation of the field amplitude with/without silver layer at the edge of the resonance layer 4 of a micro-resonator 21, wherein despite the low transmission level of 20 nm silver, by means of the arrangement at a field node the increase in the field amplitude only reduces from a factor of 25 to a factor of 15, FIG. 5 shows a representation of a field amplitude curve in an arrangement of a model photodiode (10 nm Ag, 150 nm ZnPc, 20 nm Ag) behind a micro-cavity, wherein despite the absorptive nature of the photodiode the maximum field amplitude of the micro-resonator corresponds to a gain by the factor "18".

FIG. 6 shows a representation of the intensity curve of the electric field for the photo diode shown in FIG. 8, plotted against wavelengths near the resonant frequency of the photo diode structure.

The layer of ZnPc—zinc phthalocyanine (ZnPc)—constitutes the photoactive layer 31 of the photodiode 30.

The spectrometric apparatus 100 shown in FIG. 2 body—the spectrometer—comprises when using the aforementioned apparatus 1 at least a light source 10, a filter 20 for converting spectral information into location information having an entry surface 5, on which the light components 11, 12a, 13, 14a from the light source 10 are incident, a detector 30 in the form of an organic photodiode for converting the location information into electrical signals that can be retransmitted, an evaluation unit 60, which is connected via the electrical signal-carrying connecting conductors 34 to the photo diode 30, and a display unit 35.

The filter 20 and the photodiode 30 arranged downstream of the entry surface 5 of the filter 20 contact each other in such a way that both components 20 and 30 form the single-piece monolithic unit according to the invention, wherein the filter 20 consists at least of a spectrally resolving element in the form of at least one photonic crystal 21, in which at least one layer 2, 3 is designed with a variable thickness D along a direction perpendicular to the incident light, wherein the detector 30 contacting the filter 20 consists at least of the following detector layers
a photo-active layer 31,
a first electrode 33 of the photoactive layer 31 and
a second electrode 32 of the photoactive layer 31, wherein the photoactive layer 31 is located between the two electrodes 33, 32 and one of the two electrodes, the first electrode 33, is in close contact with the photonic crystal 21, and the detector layers 31, 32, 33 are located within the resonance layer 4 of the photonic crystal 21 of the filter 20 or else the detector layers 31, 32, 33 are at the same time designed as a resonance layer 4 and act as such.

The other of the electrodes, the second electrode 32 of the photoactive layer 31, can be connected to a layer-like substrate 50.

At least one of the electrodes 32, 33 of the detector 30 can be structured.

After its passage through the filter, there is a transmitted component 13 of the incident light from the light source 10 in the transparent region of the apparatus 1, wherein the component 13 generates charge carriers 40a and/or 40b in the sensitive region of the photoactive layer 31, wherein the charge carriers 40a and/or 40b trigger a recordable signal, wherein in the detector 30 the signals emitted by the charge carriers 40a and/or 40b are conveyed via the connecting conductors 34 to the evaluation unit 60 for evaluation.

The light source emits 10 the necessary light.

FIG. 2 indicates the following signal/light components and their functions: Shown are
a long-wavelength component 11 of light during passage through the filter 20 in the long-wave spectrally sensitive region,
a short-wavelength component 12a of the light before being incident on the filter 20 in the long-wavelength transparent range,
a short-wavelength component 12b of the light before being incident on the filter 20 in the long-wavelength transparent range,
a short-wavelength component 13 of the light during passage through the filter 20 in the short-wavelength spectrally sensitive range,
a short-wavelength component 14a of the light before being incident on the filter 20 in the short-wavelength transparent range,
a short-wavelength component 14b of the light after being incident on the filter 20 in the short-wavelength transparent range.

The above ranges represent wavelength ranges.

The advantages of the monolithic device 1 according to the invention and the spectrometric apparatus 100 containing the monolithic device 1 consist of the following:

In the apparatus 1 according to the invention, due to the direct connection between the detector/photodiode 30 and the spectrally resolving element 20—the filter—any misalignment of the essential apparatus components 30, 20 is excluded. in addition, no spectral calibration of the apparatus 1 is necessary. The advantageously low thermal expansion and the simple facility for encapsulation of the photodiode 30 with/in the filter 20 allow its use in confined and harsh environments.

The structure of the monolithic apparatus 1 according to the invention from filter 20 and detector 30 can be produced as an integral unit in one process (e.g. PVD processes for filter and detector layers), which results in a very cost-effective sensor.

The choice of (partially)transparent materials for filter 20 and detector 30 and substrate 50 enables a parallel passage of light with simultaneous analysis of the spectrum.

If the detector layers 33, 32, 31 are integrated in the filter 20, then an improved sensitivity can be achieved under low material consumption of the photoactive materials in the photoactive layer 31 (field amplification in micro-resonators and a high number of circuits of resonant photons).

A further advantage is the fact that, as shown in FIG. 1, the detector/photodiode 30 is arranged behind the filter 20 with a high Q-factor integration, in order to achieve a high spectral resolution of the input signal 11, 13.

REFERENCE LIST 1 device
2 first material layer having specified refractive index 3 second layer of material having differently specified refractive index
4 resonance layer/micro-cavity
5 entry surface of the filter
10 light source
11 long-wavelength component of the light during passage through the filter in the long-wave spectrally sensitive range,
12a short-wavelength component of the light before being incident on the filter in the long-wavelength transparent range,
12b short-wavelength component of the light before being incident on the filter in the long-wavelength transparent range,
13 short-wavelength component of the light during passage through the filter in the short-wavelength spectrally sensitive range,
14a short-wavelength component of the light before being incident on the filter in the short-wavelength transparent range,
14b short-wavelength component of the light before being incident on the filter in the short-wavelength transparent range
20 filter
21 photonic crystal/micro-resonator
30 detector/organic photodiode
31 photoactive layer/detector layer
32 second electrode of the photoactive layer/second detector layer
33 first electrode of the photoactive layer/first detector layer
34 connecting conductor/s
35 display unit
40a charge carriers in the long-wavelength sensitive region of the photoactive layer
40b charge carriers in the short-wavelength sensitive region of the photoactive layer
50 substrate
60 evaluation unit
100 spectrometric apparatus in accordance with the invention
101 apparatus according to the prior art
102 spectrometric apparatus according to the prior art
Ag silver
ZnPc zinc phthalocyanine
MC micro-cavity
PD photodiode
T titanium dioxide
S silicon dioxide
C low refractive-index material (n=1.5)
D thickness

The invention claimed is:

1. Apparatus for spectrometrically capturing light, comprising at least:
    a wavelength-adjustable filter for converting spectral information into location information and
    an organic photodiode serving as a detector for converting the location information into electrical signals that can be retransmitted,
wherein the filter and the organic photodiode form a single-piece monolith, wherein the organic photodiode is combined with the filter in a connection arrangement or the organic photodiode is integrated into the filter,
wherein the filter comprises at least
a spectrally resolving element in the form of at least one layer-like photonic crystal constituting the monolith, in which two layers having variable thickness D are formed along a direction perpendicular to incident light, wherein a resonance layer is arranged between the two layers,
wherein the organic photodiode contacting the filter comprises at least the following detector layers:
    a photo-active layer,
    a first electrode of the photoactive layer and
    a second electrode of the photoactive layer,
wherein the photoactive layer is located between the first and second electrodes and one of the electrodes is in contact with the photonic crystal,
wherein:
    the photoactive layer,
    the first electrode of the photoactive layer and
    the second electrode of the photoactive layer,
are located within the resonance layer of the photonic crystal of the filter.

2. The apparatus according to claim 1,
wherein:
    the filter and the photodiode are arranged downstream of an entry surface of the filter and contact each other in such a way that they form the monolithic unit, and
    at least one layer of the spectrally resolving element has a wavelength-matched adjustable thickness D along a direction perpendicular to the incident light.

3. The apparatus according to claim 2,
wherein:
    one of the first and second electrodes of the photoactive layer is connected to a layer-like substrate.

4. The apparatus according to claim 1,
wherein:
    the photoactive layer of the organic photodiode, by generation of light radiation charge carriers is located in a long-wavelength sensitive range and/or by generation of charge carriers is located in a short-wavelength sensitive range.

5. The apparatus according to claim 1,
wherein:
    the filter comprises a linear graduated filter with Bragg reflectors.

6. The apparatus according to claim 1,
wherein:
    the filter comprises a wavelength-dependent and wavelength-adjustable micro-resonator,
    wherein the micro-resonator comprises a dielectric mirror arrangement,
    comprising at least:
    a first mirror layer arrangement having alternating material layers of high refractive index and low refractive index,
    a second mirror layer arrangement having alternating material layers of high refractive index and low refractive index, and
    a resonance layer located between the first and the second mirror layer arrangements.

7. The apparatus according to claim 6,
wherein;
    a transparent layer is applied on one of the layer arrangements as a substrate for mechanically stabilizing the filter.

8. The apparatus according to claim 6,
wherein:
    the wavelength-adjustable micro-resonator is wedge-shaped.

9. The apparatus according to claim 1,
wherein:
    the filter comprises a wavelength-dependent and wavelength-adjustable micro-resonator, wherein the micro-resonator comprises at least:
- a first layer stack having a first specified refractive index,
- a second layer stack having a second specified refractive index, wherein the first specified refractive index and the second specified refractive index differ from each other, and
- a resonance layer arranged between the first and the second layer stacks, wherein at least one of the first or the second layer stacks or the resonance layer has a variable constantly increasing thickness D along the direction perpendicular to the incident light.

10. A spectrometric apparatus for spectrometrically capturing light at least comprising
- a light source,
- a filter for converting spectral information into location information having an entry surface, on which light components from the light source are incident,
- a detector in the form of an organic photodiode for converting the location information into electrical signals that can be retransmitted,
- an evaluation unit, which is connected to the photo diode via electrical signal-carrying connecting conductors, and
- a display unit, wherein the filter and the organic photodiode contact each other in such a way that they form a monolithic unit, wherein the filter comprises at least a spectrally resolving element in the form of at least one photonic crystal, in which at least one layer has a variable thickness D for adjusting a specified wavelength range along a direction perpendicular to the incident light, wherein the photodiode contacting the filter comprises at least the following detector layers:
- a photoactive layer for generating charge carriers,
- a first electrode of the photoactive layer and
- a second electrode of the photoactive layer, wherein the photoactive layer is located between the first and second electrodes and one of the two electrodes is in contact with the photonic crystal and the detector layers are located within a resonance layer of the photonic crystal of the filter.

11. The apparatus according to claim 10, wherein:
a second of the two electrodes of the photoactive layer is connected to a layer-like substrate.

12. The apparatus according to claim 10, wherein:
at least one of the electrodes of the organic photodiode is structured.

13. The apparatus according to claim 10, wherein:
connection conductors are situated between the photodiode and the evaluation unit.

14. The apparatus according to claim 13, wherein:
after its passage through the filter, there is a transmitted component of the light from the light source in the transparent region of the apparatus, wherein the transmitted component of the light generates charge carriers in a sensitive region of the photoactive layer, and wherein the electrical signal obtained is passed via the connecting conductors to the evaluation unit or evaluation.

* * * * *